United States Patent
Hwang et al.

[11] Patent Number: 5,834,804
[45] Date of Patent: Nov. 10, 1998

[54] FERROELECTRIC STRUCTURE INCLUDING MGTIO₃ PASSIVATION

[75] Inventors: Cheol-seong Hwang, Kyungki-do; Choong-ho Lee, Taegu, both of Rep. of Korea

[73] Assignee: Samsung Electronics Co., Ltd., Suwon, Rep. of Korea

[21] Appl. No.: 951,433

[22] Filed: Oct. 16, 1997

[30] Foreign Application Priority Data

Oct. 28, 1996 [KR] Rep. of Korea .................. 96-49350

[51] Int. Cl.⁶ ................. H01L 29/76; H01L 29/94; H01L 31/062; H01L 31/113
[52] U.S. Cl. ............................. 257/295; 257/632
[58] Field of Search ..................... 257/295, 632

[56] References Cited

U.S. PATENT DOCUMENTS

| | | |
|---|---|---|
| 4,592,880 | 6/1986 | Murakami . |
| 5,140,498 | 8/1992 | Radford et al. . |
| 5,623,724 | 4/1997 | Gurkovich et al. . |

OTHER PUBLICATIONS

Tokumitsu et al., "Film Quality Dependence of Adaptive-Learning Processes in Neurodevices Using Ferroelectric PbZr$_x$Ti$_{1-x}$O$_3$(PZT) Films", Journal of Applied Physics, vol. 34(1995) Pt. 1, No. 2B, pp. 1061–1065.

*Primary Examiner*—Stephen Meier
*Attorney, Agent, or Firm*—Myers Bigel Sibley & Sajovec

[57] ABSTRACT

An MgTiO$_3$ film is used as a diffusion-barrier layer and/or a buffer layer for a ferroelectric film such as a PZT film. The MgTiO$_3$ films may be used in ferroelectric capacitors which can be included in FRAM devices, and in ferroelectric floating gate transistors which can be included in FFRAM devices. Associated fabrication methods are also provided.

13 Claims, 4 Drawing Sheets

FERROELECTRIC STRUCTURE INCLUDING MGTIO₃ PASSIVATION

FIELD OF THE INVENTION

This invention relates to integrated circuit devices and fabrication methods therefor and more particularly to ferroelectric structures and fabricating methods therefor.

BACKGROUND OF THE INVENTION

Ferroelectric materials are being widely investigated and used for integrated circuit devices. As is well known, a ferroelectric material exhibits a spontaneous electric polarization that can be reversed or reoriented by application of an electric field. One widely used ferroelectric material is Pb (Ti, Zr)$O_3$, commonly referred to as PZT.

Due to the bistable spontaneous polarization characteristics of ferroelectric materials, they have been investigated for use in integrated circuit memory devices. Presently, there are two general types of integrated circuit memory devices that use ferroelectric materials. The first is referred to as a Ferroelectric Random Access Memory (FRAM), each cell of which includes a single transistor and a single capacitor similar to a Dynamic Random Access Memory (DRAM). The second type is referred to as a Ferroelectric Floating Gate Random Access Memory (FFRAM) which uses the ferroelectric material as a floating gate of a transistor so that the conductance of the transistor channel can be controlled according to the direction of the spontaneous polarization of the ferroelectric material. These devices are being widely investigated for future memory devices because they can be nonvolatile, and are capable of operating at high speeds and low voltages, and are capable of being fabricated at high integration densities.

PZT is the most widely used ferroelectric material. Unfortunately, it is known that processing related problems may occur in fabricating integrated circuits using PZT because Pb (lead) from the PZT may react with or diffuse into adjacent regions due to its high chemical reactivity. In particular, in fabricating an FRAM device, Pb can react with or diffuse into the silicon dioxide ($SiO_2$) layer that is used to passivate a PZT capacitor. In an FFRAM device, the Pb can react or diffuse into the silicon which forms the underlying transistor, or into the silicon dioxide ($SiO_2$) gate oxide of the transistor.

In order to reduce the diffusion or reaction of Pb, it is known to form a titanium dioxide ($TiO_2$) barrier between the PZT and the silicon dioxide. For example, FIG. 1 illustrates a ferroelectric capacitor structure, which may be used in an FRAM, and which uses $TiO_2$ as a diffusion barrier. The structure includes an integrated circuit substrate 1 having a field oxide film 2. A capacitor is formed on the field oxide film 2. The capacitor includes a lower electrode 3, a PZT film 4 and an upper electrode 5. The upper and lower electrodes 5 and 3 respectively are typically formed of platinum. An $SiO_2$ layer 6 is formed on the substrate including the capacitor. The $SiO_2$ layer 6 includes contact holes on the upper and lower electrodes 5 and 3 respectively. A conductor such as a metal 7 fills the contact holes. As shown, a $TiO_2$ film 8 is located between the PZT film 4 and the $SiO_2$ layer 6.

In an FFRAM, an insulator such as $CeO_2$, $Y_2O_3$ or yttria stabilized zirconia (YSZ) is used as a diffusion-barrier layer. A Metal-Ferroelectric-Metal-Insulator-Semiconductor (MFMIS) structure is thus formed, including an upper electrode, a ferroelectric layer, an insulating layer and a semiconductor. The upper electrode may be formed of Ir/$IrO_2$.

FIG. 2 illustrates a section of an FFRAM device using $CeO_2$, $Y_2O_3$ or YSZ as a diffusion-barrier layer. The FFRAM device includes a silicon substrate 21, a ferroelectric film 22 and an upper electrode 23. An $SiO_2$ layer 24 includes a contact hole for the upper electrode 23, and a conductor such as metal 25 fills the contact hole. A diffusion-barrier layer 26 comprising $CeO_2$, $Y_2O_3$ or YSZ is included between the silicon substrate 21 and the ferroelectric film 22. The diffusion barrier layer is also referred to as a "buffer layer".

Unfortunately, the diffusion-barrier layers which have heretofore been used with PZT films may have undesirable characteristics. In particular, the $TiO_2$ which is used in the FRAM of FIG. 1 acts as a sacrificial barrier by reacting with Pb which diffuses from the PZT. Thus, the $TiO_2$ layer prevents Pb from reaching the $SiO_2$. However, $TiO_2$ may be limited in preventing the out diffusion of Pb from the PZT film. Since the Pb is allowed to out diffuse from the PZT film, the composition of the PZT film can vary and the electrical characteristics thereof may degrade.

Similarly, for the FFRAM of FIG. 2, a dielectric such as $CeO_2$, $Y_2O_3$ or YSZ have a relatively low dielectric constant. However, a high dielectric constant is generally desired in the FFRAM. Moreover, these insulation layers may have less than desirable diffusion-barrier characteristics.

SUMMARY OF THE INVENTION

It is therefore an object of the present invention to provide improved ferroelectric structures including capacitors, Ferroelectric Random Access Memories and Ferroelectric Floating Gate Random Access Memories, and methods of fabricating the same.

It is yet another object of the present invention to provide improved diffusion-barrier structures for ferroelectric films and methods of fabricating the same.

These and other objects are provided, according to the present invention, by using an $MgTiO_3$ film as a diffusion barrier or buffer layer for a ferroelectric material such as PZT. Accordingly, an $MgTiO_3$ film is used as a barrier between a PZT film and one or more silicon containing regions.

$MgTiO_3$ is an ionic oxide having an illmenite structure and has a dielectric constant of about 17. Although its chemical formula is of an $ABO_3$ type, $MgTiO_3$ has no perovskite crystalline structure, unlike other $ABO_3$-type materials such as PZT, $PbTiO_3$ or BST, because the ionic radius of Mg positioned in A of $ABO_3$ is much smaller than Pb or Ba. Thus, $MgTiO_3$ has a crystalline structure different from PZT and forms no solid solution.

In addition, since $MgTiO_3$ is a compound of a ternary system, unlike compounds of a binary system such as $TiO_3$, $ZrO_2$, and the like, and because it has a Gibb's free energy of formation similar to that of PZT, $MgTiO_3$ does not react with Pb from PZT and forms no new compound. Thus, $MgTiO_3$ can satisfy the requirements of a diffusion-barrier layer in fabricating a device using a ferroelectric such as PZT, due to its properties such as reaction speed and thermal dynamics, relative to other diffusion-barrier layers.

Passivation structures for a PZT film, according to the invention, comprise an insulation layer including silicon on the PZT film and an $MgTiO_3$ film between the PZT film and the insulation layer. In one embodiment, the PZT film includes a pair of opposing faces and a sidewall and the insulation layer is on one of the opposing faces and on the sidewall of the PZT film. The $MgTiO_3$ film is between the PZT film and the insulation layer on the one of the opposing faces and on the sidewall of the PCT film. In another embodiment, the passivation structure further comprises a conductive layer on a second portion of one of the opposing faces, and the insulation layer extends onto the conductive layer. In this embodiment, the $MgTiO_3$ film also extends between the conductive layer and the insulation layer. In yet another embodiment, a conductive layer covers one of the opposing faces and exposes the sidewall. The insulation layer is on the sidewall and on the conductive layer opposite the PZT film, and the $MgTiO_3$ film extends between the insulation layer and the sidewall and the conductive layer.

$MgTiO_3$ films may be used as diffusion-barrier layers for ferroelectric capacitor structures which may be used in a Ferroelectric Random Access Memory (FRAM) and in a floating gate transistor structure which may be used in a Ferroelectric Floating Gate Access Memory (FFRAM). A ferroelectric capacitor structure, which may be used in a FRAM, includes a ferroelectric capacitor comprising spaced apart conductive layers and a PZT film dielectric therebetween. An insulation layer including silicon, is on the ferroelectric capacitor, and an $MgTiO_3$ film is included between the PZT film and the insulation layer. The insulation layer including silicon, is preferably a silicon dioxide layer. The ferroelectric capacitor structure may be included on a field oxide layer of an integrated circuit substrate such as a FRAM substrate. The spaced apart conductive layers include conductive layer sidewalls and the PZT film includes a PZT film sidewall. The insulation layer including silicon, is on the conductive layer sidewalls and/or the PZT film sidewall, and the $MgTiO_3$ film is between the insulation layer and the conductive layer sidewalls and the PZT film sidewall.

In another embodiment, ferroelectric structures may be used to form the ferroelectric floating gate transistors of a FFRAM. These structures comprise an underlayer including silicon, and a PZT film on the underlayer. A first $MgTiO_3$ film is included between the underlayer and the PZT film. The underlayer preferably comprises a silicon underlayer or a silicon dioxide underlayer. For example, the silicon underlayer may be the channel region of a floating gate transistor and the silicon dioxide underlayer may be the gate dielectric of a floating gate transistor. The ferroelectric structure may also include a conductive layer on the PZT film opposite the underlayer. The conductive film may form the gate electrode for the floating gate. An insulation layer including silicon, is located on the PZT film sidewall and on the conductive layer opposite the PZT film. A second $MgTiO_3$ film is included between the insulation layer and the PZT film sidewall and the conductive layer.

Accordingly, a ferroelectric structure may include a ferroelectric film and a conductive film on the ferroelectric film, and an $MgTiO_3$ film that surrounds the ferroelectric film and the conductive layer. At least one layer including silicon, surrounds the $MgTiO_3$ film. Improved diffusion barriers for PZT films are thereby provided.

Methods of passivating PZT films according to the invention include the steps of forming an $MgTiO_3$ film on the PZT film and forming an insulation layer including silicon on the $MgTiO_3$ film opposite the PZT film. The $MgTiO_3$ film may be formed by Metal Organic Chemical Vapor Deposition, sputtering, sol-gel, Metal Organic Decomposition, evaporation or laser ablation. The $MgTiO_3$ film may be formed on the PZT film sidewall.

Methods of fabricating ferroelectric capacitors, according to the invention, include the steps of forming a ferroelectric capacitor on a field oxide region of an integrated circuit substrate, the ferroelectric capacitor including an outer surface opposite the field oxide region and a sidewall extending between the outer surface and the field oxide region. An $MgTiO_3$ film is formed on the sidewall and on the outer surface. An insulation layer including silicon, is then formed on the $MgTiO_3$ film, opposite the sidewall and the outer surface. The insulation layer is preferably a silicon dioxide layer.

Ferroelectric structures which may be used for FRAMs are also formed by forming a first $MgTiO_3$ film on an underlayer including silicon. A ferroelectric film is formed on the first $MgTiO_3$ film opposite the underlayer and a conductive layer is formed on the ferroelectric film, opposite the first $MgTiO_3$ film. The ferroelectric film includes a ferroelectric film sidewall and the conductive layer includes a conductive layer sidewall. A second $MgTiO_3$ film is formed on the conductive layer opposite the ferroelectric film, on the ferroelectric film sidewall and on the conductive layer sidewall. An insulation layer including silicon, is then formed on the second $MgTiO_3$ film opposite the conductive layer and conductive layer sidewall and opposite the ferroelectric film sidewall.

Accordingly, improved diffusion barriers may be formed for ferroelectric films such as PZT. The improved diffusion barriers may be used to fabricate ferroelectric capacitors and floating gate transistors which may be used in FRAM and FFRAM devices.

DETAILED DESCRIPTION OF PREFERRED EMBODIMENTS

Figure 1:
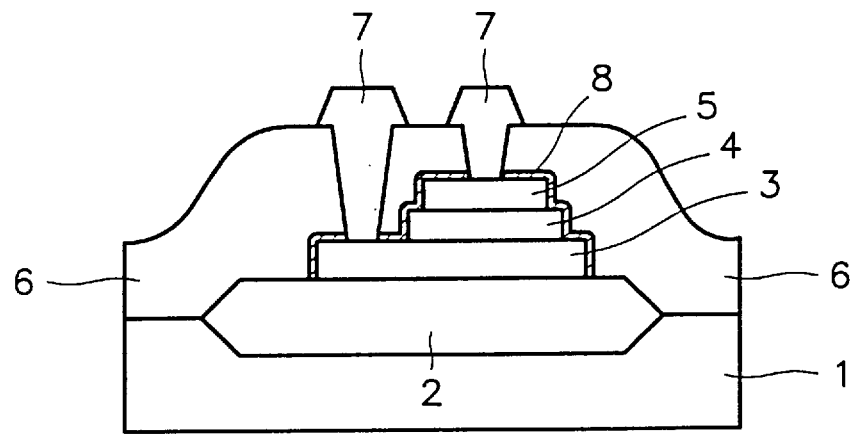
FIG. 1 is a cross-sectional view of a conventional ferroelectric capacitor that may be part of a FRAM device, using $TiO_3$ for a diffusion barrier.
Figure 2:
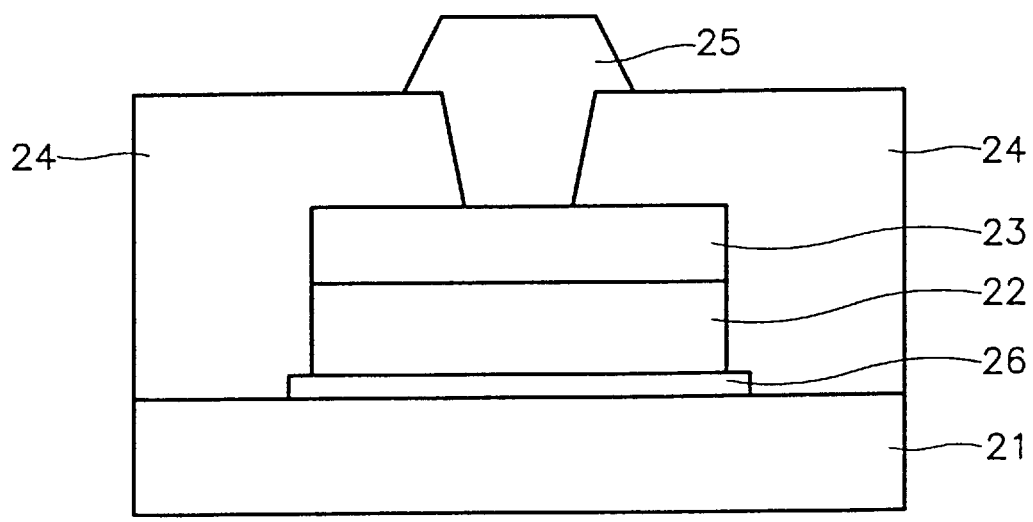
FIG. 2 is a cross-sectional view of a conventional floating gate transistor that may be part of a FFRAM device, using $CeO_2$, $Y_2O_3$ or YSZ for a diffusion-barrier layer.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 3:
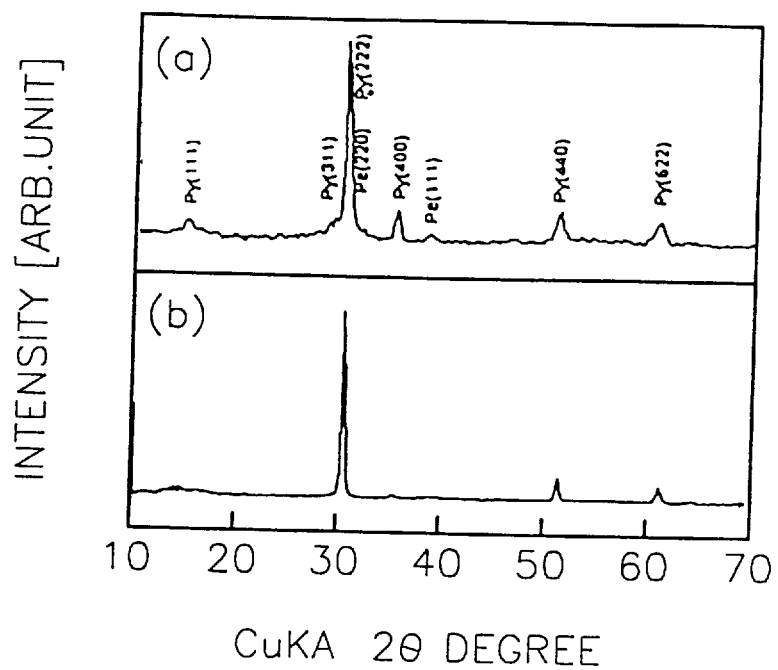
FIG. 3 shows X-ray diffraction (XRD) patterns of a PZT film deposited on a silicon substrate by MOCVD.

FIG. 3 illustrates X-ray diffraction (XRD) patterns of a PZT film directly deposited on a silicon substrate by MOCVD, at 500° C. as indicated by (a) and at 550° C. as indicated by (b). As noted from FIG. 3, undesired pyrochlore phases may be formed at low temperature, and severe reaction between the deposited PZT and the substrate at high temperature may prevent deposition of a crystalline film.

Figure 4:
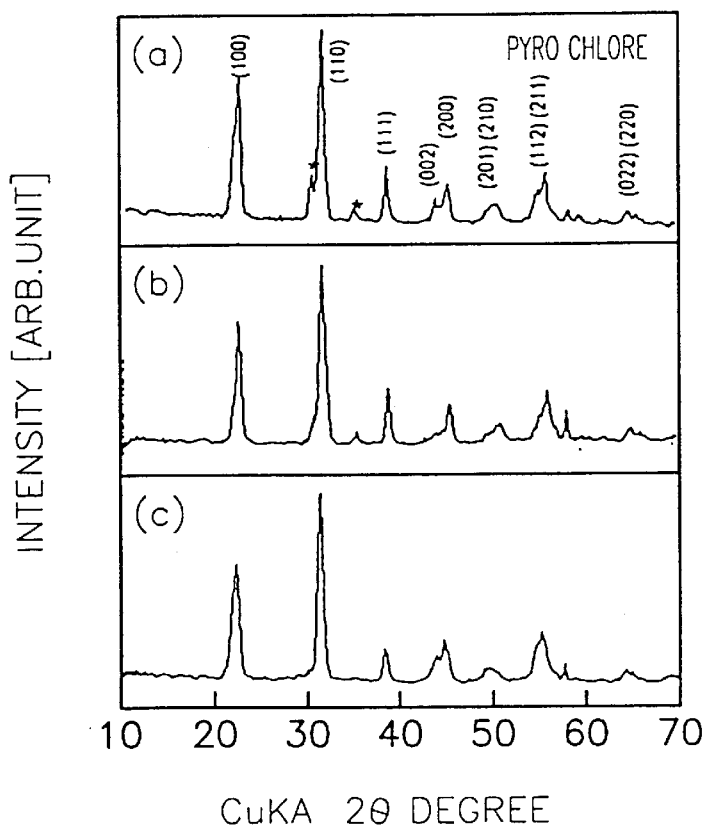
FIG. 4 shows XRD patterns of a PZT film on a silicon substrate having an $MgTiO_3$ film thereon according to the present invention.

FIG. 4 shows XRD patterns of a PZT film deposited on a silicon substrate having $MgTiO_3$ deposited thereon according to the invention at temperatures of (a) 500° C., (b) 550° C. and (c) 600° C. As shown in FIG. 4, PZT phases are formed on the silicon substrate having $MgTiO_3$ deposited thereon because $MgTiO_3$ reduces and preferably prevents mutual diffusion and reaction between PZT and silicon.

Figure 5:
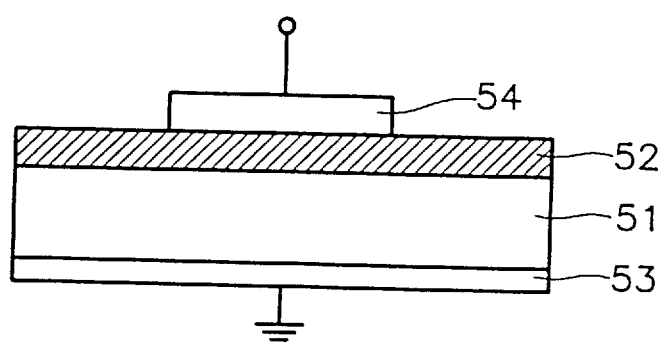
FIG. 5 is a diagram showing a test sample for testing the ferroelectric properties of an $MgTiO_3$/PZT double layer on a silicon substrate.

FIG. 5 is a cross-sectional view of a test sample fabricated to test the ferroelectric properties of an $MgTiO_3$/PZT double layer on a silicon substrate according to the present invention. An $MgTiO_3$/PZT double layer 52 is formed on a silicon substrate 51. Al layers 53 and 54 are deposited on the double layer 52 and beneath the silicon substrate 51, respectively, thus forming an MFIS structure.

Figure 6:
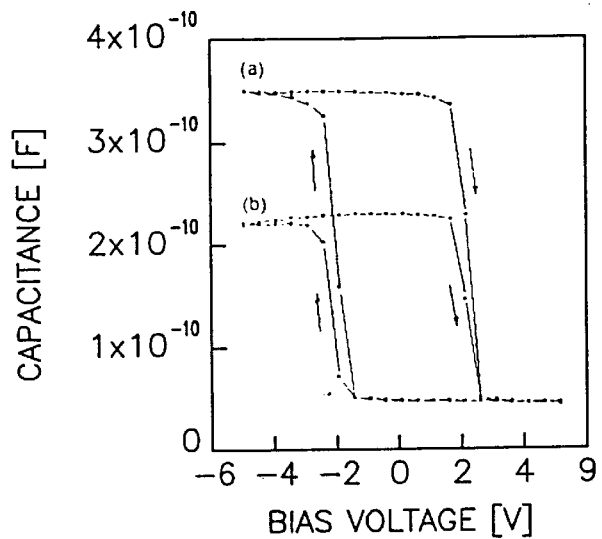
FIG. 6 is a graph showing voltage-capacitance characteristics of the test sample shown in FIG. 5, which are measured at 50 KHz as indicated by (a) and at 1 MHz as indicated by (b)

FIG. 6 shows the results of measuring voltage-capacitance characteristics of the sample of FIG. 5 at 50 KHz as indicated by (a) and 1 MHz as indicated by (b). As shown in FIG. 6, a clearly defined hysteresis curve is obtained. From the curve, it is noted that the deposited PZT has good ferroelectric properties, which implies that the $MgTiO_3$ film serves an excellent buffer layer for deposition of PZT and for reducing or preventing diffusion of PZT. In addition, since voltage margins for sensing a signal are generally about 4 V in memory devices, stable operation can be expected.

Figure 7:
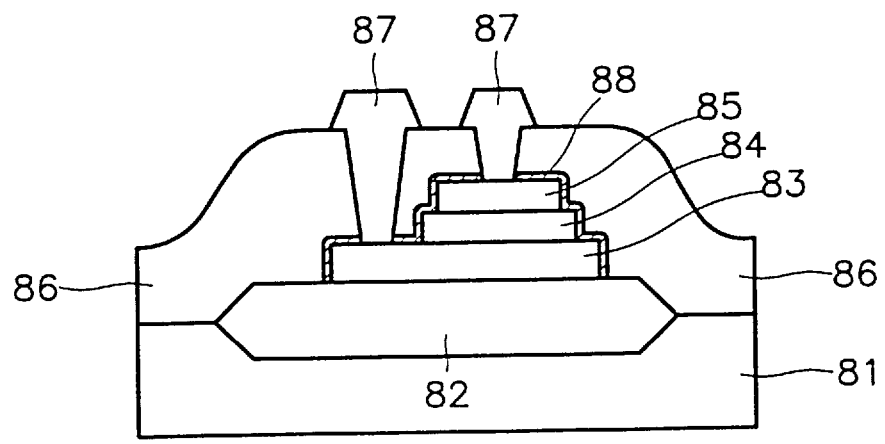
FIG. 7 is a cross-sectional view of a ferroelectric capacitor that may be part of a FRAM device, including an $MgTiO_3$ film as a diffusion-barrier layer according to the invention.

FIG. 7 shows a cross-section of a ferroelectric capacitor which may be included in part of a FRAM device, using $MgTiO_3$ for a diffusion-barrier layer according to the invention. The FRAM device has a field oxide film 82 on a semiconductor substrate 81, a lower electrode 83, a PZT film 84, and an upper electrode 85. The upper and lower electrodes 85 and 83 are generally formed of platinum. These regions may be sequentially formed on the field oxide film 82. An $SiO_2$ layer 86 is also included. The $SiO_2$ layer includes contact holes on the upper and lower electrodes 85 and 83, and covers the surface of the substrate having the capacitor structure thereon. In particular, the $SiO_2$ layer 86 is on the sidewalls of the electrodes 83 and 85 and the sidewall of the PZT film 84. Conductive regions such as metal regions 87 fill the contact holes.

Still referring to FIG. 7, an $MgTiO_3$ film 88 is included as a diffusion-barrier layer between the PZT film 84 and the $SiO_2$ layer 86. The $MgTiO_3$ film is included on the electrode sidewalls and on the PZT film 84, and on the outer face of the upper electrode 85.

A ferroelectric capacitor fabricating method may use $MgTiO_3$ film forming methods of the present invention, and may be used to fabricate FRAM devices. In methods of the present invention, after the field oxide film 82 is formed on the semiconductor substrate 81, and a platinum layer is deposited on the oxide film 82 to form the lower electrode of a capacitor. The platinum layer is generally patterned by sputtering. The PZT film 85 may be deposited on the patterned platinum layer by sol-gel or vacuum evaporation.

In a sol-gel method, a PZT material is spin-coated, dried, and then hardened at about 400° C. The appropriate thickness of the PZT film can be obtained by repeating the above steps. After the desired thickness is obtained, the PZT film is annealed in an oxygen atmosphere.

In a vacuum evaporation method, PbO powder and a $ZrO_2/TiO_2$ pellet are used for the PZT film. Because the vapor pressure of the PbO is lower than that of $ZrO_2/TiO_2$, PbO is deposited by heating the material. $ZrO_2/TiO_2$ is deposited by electron beams.

A capacitor is completed by forming the upper electrode 85 of platinum on the PZT film 84. Then, the $MgTiO_3$ film 88 is deposited on the upper surface and the sidewalls of the capacitor. The $MgTiO_3$ film 88 may be formed by MOCVD, sputtering, sol-gel, MOD, evaporation, or laser-ablation.

Figure 8:
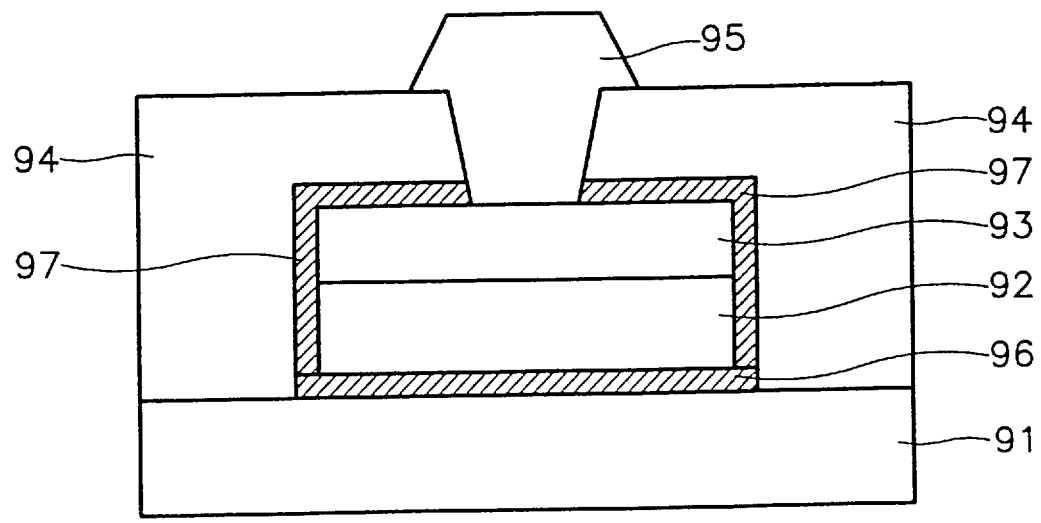
FIG. 8 is a cross-sectional view of a ferroelectric floating gate transistor that may be part of a FFRAM, including an $MgTiO_3$ film as a buffer layer for PZT according to the invention.

FIG. 8 illustrates a ferroelectric floating gate transistor which may be included in an FFRAM device, and which includes an $MgTiO_3$ film as a buffer layer for PZT according to the invention. The device includes a semiconductor substrate 91, including spaced apart source and drain regions. A ferroelectric film 92 and an upper electrode 93 are sequentially formed on the semiconductor substrate 91. $SiO_2$ layer 94 includes a contact hole on the upper electrode 93, and a conductor such as metal 95 fills the contact hole.

Still referring to FIG. 8, a first $MgTiO_3$ film 96 is included as a buffer layer between the silicon substrate and the ferroelectric film. A second $MgTiO_3$ film 97 is included between the stacked structure of the ferroelectric film and the upper electrode 92 and 93, and the $SiO_2$ layer 94. It will be understood that the underlayer containing silicon may be a gate oxide film on the silicon substrate.

Ferroelectric floating gate transistor fabricating methods of the present invention may be used to fabricate FFRAM devices. In methods of the present invention, the first $MgTiO_3$ film 96 is formed on a predetermined portion of the underlayer 91 including silicon. The underlayer 91 may be a silicon substrate or a gate oxide film. Then, the PZT film 92 and the upper electrode 93 are sequentially formed on the first $MgTiO_3$ film 96. The PZT film forming method may be the same as that for manufacturing the FRAM device as described above. The upper electrode 93 may be platinum and may be formed by sputtering.

Then, the second $MgTiO_3$ film 97 is deposited on the surface of the stacked structure of the first $MgTiO_3$ layer 96, the PZT layer 92, and the upper electrode 93, including on the sidewall of the PZT layer 92 and the upper electrode 93, so that the first and second $MgTiO_3$ films 96 and 97 surround the PZT film 92 and the upper electrode 93. Then, the $SiO_2$ layer 94 is formed on the surface of the structure. The $SiO_2$ layer 94 has a contact hole filled with conductor such as metal 95, and is connected to the upper electrode 93. The first and second $MgTiO_3$ layers may be formed by MOCVD, sputtering, sol-gel, MOD, evaporation, or layer-ablation methods.

According to the present invention as described above, diffusion-barrier layers including $MgTiO_3$ can provide excellent diffusion-barrier effects. Buffer layers including $MgTiO_3$ can provide excellent diffusion-barrier characteristics and a high dielectric constant.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A passivation structure for a PZT film comprising:
an insulation layer including silicon on the PZT film; and
an $MgTiO_3$ film between the PZT film and the insulation layer.

2. A passivation structure according to claim 1:
wherein the PZT film includes a pair of opposing faces and a sidewall;
wherein the insulation layer is on one of the opposing faces and on the sidewall of the PZT film; and
wherein the $MgTiO_3$ film is between the PZT film and the insulation layer on the one of the opposing faces and on the sidewall of the PZT film.

3. A passivation structure according to claim 2:
wherein the insulation layer is on a first portion of the one of the opposing faces of the PZT film, the passivation structure further comprising a conductive layer on a second portion of the one of the opposing faces;
wherein the insulation layer extends onto the conductive layer; and
wherein the $MgTiO_3$ film also extends between the conductive layer and the insulation layer.

4. A passivation structure according to claim 1:
wherein the PZT film includes a pair of opposing faces and a sidewall, the passivation structure further comprising a conductive layer covering one of the opposing faces and exposing the sidewall;
wherein the insulation layer is on the sidewall and on the conductive layer opposite the PZT film; and
wherein the $MgTiO_3$ film extends between the insulation layer and the sidewall and the conductive layer.

5. A ferroelectric capacitor structure comprising:
a ferroelectric capacitor including spaced apart conductive layers and a PZT film dielectric therebetween;
an insulation layer including silicon on the ferroelectric capacitor; and
an $MgTiO_3$ film between the PZT film and the insulation layer.

6. A ferroelectric capacitor structure according to claim 5 wherein the insulation layer including silicon is a silicon dioxide layer.

7. A ferroelectric capacitor structure according to claim 5 further comprising:
an integrated circuit substrate including a field oxide layer;
wherein the ferroelectric capacitor is on the field oxide layer.

8. A ferroelectric capacitor structure according to claim 5:
wherein the spaced apart conductive layers each include conductive layer sidewalls and wherein the PZT film includes a PZT film sidewall;
wherein the insulation layer including silicon is on the conductive layer sidewalls and on the PZT film sidewall; and
wherein the $MgTiO_3$ film is between the insulation layer and the conductive layer sidewalls and the PZT film sidewall.

9. A ferroelectric structure comprising:
an underlayer including silicon;
a PZT film on the underlayer; and
a first $MgTiO_3$ film between the underlayer and the PZT film.

10. A ferroelectric structure according to claim 9 wherein the underlayer comprises a silicon underlayer or a silicon dioxide underlayer.

11. A ferroelectric structure according to claim 9 further comprising:
a conductive layer on the PZT film opposite the underlayer, the PZT film including a PZT film sidewall;
an insulation layer including silicon on the PZT film sidewall and on the conductive layer opposite the PZT film; and
a second $MgTiO_3$ film between the insulation layer and the PZT film sidewall and the conductive layer.

12. A ferroelectric structure comprising:
a ferroelectric film;
a conductive film on the ferroelectric film; and
an $MgTiO_3$ film that surrounds the ferroelectric film and the conductive film.

13. A ferroelectric structure according to claim 12 further comprising at least one layer including silicon surrounding the $MgTiO_3$ film.

* * * * *